United States Patent
Ingram et al.

(10) Patent No.: US 6,259,335 B1
(45) Date of Patent: Jul. 10, 2001

(54) COMBINING NETWORK TO IMPLEMENT A POWER AMPLIFIER HAVING MONOLITHICALLY INTEGRATED PLANAR INTERCONNECT AND TRANSISTORS

(75) Inventors: Daisy L. Ingram, Cerritos; Huan-Chun Yen, Torrance; Yaochung Chen, Rancho Palos Verdes, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/371,396

(22) Filed: Aug. 10, 1999

(51) Int. Cl.[7] .............................. H01P 3/08; H01P 5/12; H03F 3/213; H03F 3/60; H03H 7/38
(52) U.S. Cl. .............................. 333/128; 333/33; 333/34; 330/286; 330/295
(58) Field of Search ............................. 333/128, 33, 34; 330/286, 295

(56) References Cited

U.S. PATENT DOCUMENTS

| | | | |
|---|---|---|---|
| 5,132,641 | * | 7/1992 | Khandavalli ................ 333/128 X |
| 5,942,957 | * | 8/1999 | Mohwinkel et al. ............ 333/128 |

FOREIGN PATENT DOCUMENTS 60-247303 * 12/1985 (JP) ............................ 333/128
2-274101 * 11/1990 (JP) ............................ 333/128

OTHER PUBLICATIONS

Ingram et al., "A 427 mW, 20% Compact W–Band InP HEMT MMIC Power Amplifier," TRW, RF Products Center, Jun. 1999.

Chen et al, "A 95–GHz InP HEMT MMIC Amplifier with 427–mW Power Output," Nov. 1998, IEEE Microwave and Guided Wave Letters, vol. 8, No. 11, pp. 399–401.

Stones et al., "Q. and V–Band Planar Combiners," Jun. 1991, IEEE MTT–S Digest, pp. 1049–1052.

* cited by examiner

Primary Examiner—Robert Pascal
Assistant Examiner—Barbara Summons
(74) Attorney, Agent, or Firm—Connie M. Thousand

(57) ABSTRACT

An umbrella-shaped matching network (10, 14, 16) for matching phase and impedance in a power amplifier (2). The matching network (10, 14, 16) employs rounded corners (22). The rounded corners (22) reduce microwave signal scattering losses, because they are less prone to signal radiation than square corner power combining networks. The matching network (10, 14, 16) includes slits (24) defining separated arms (26). The slits (24) are positioned in such a way that they provide phase and amplitude balance for the signal presented to the amplifiers (2). The slits (24) also prevent current from traveling transversely.

21 Claims, 1 Drawing Sheet

COMBINING NETWORK TO IMPLEMENT A POWER AMPLIFIER HAVING MONOLITHICALLY INTEGRATED PLANAR INTERCONNECT AND TRANSISTORS

This invention was made with Government support under contract number N66001-96-C-8629 awarded by the US Army Research Laboratory. The Government has certain rights in this invention.

BACKGROUND OF THE INVENTION

1. Field of the Invention

This invention relates generally to combining networks for power amplifiers and, more particularly, to an amplitude and phase impedance matching network for use in monolithic microwave integrated circuit (MMIC) power amplifiers.

2. Discussion of Related Art

Power amplifiers are an integral part of a myriad of electronic systems. For example, power amplifiers are used in televisions, cellular phones, audio and video receivers and transmitters, radios, compact disc players, satellites, automotive electronics, as well as many other devices. Power amplifiers typically employ transistors that perform amplification and accommodate the high currents and high power dissipation within the amplifier. These transistors are typically field-effect transistors (FETs) fabricated on GaAs (Gallium-Arsenide) or InP (Indium-Phosphide) substrates, but can be other types of transistors, such as bipolar transistors and fabricated on other semiconductor materials. The transistors are connected to other circuit elements, such as resistors, capacitors and inductors, or to power supplies or common terminals to form connections with other transistors in an overall network to provide the power amplifier.

The power transistors have a dramatic impact on the efficiency and the overall performance of power amplifier circuits. An InP high electron mobility transistor (HEMT) is the preferred type of transistor for these applications. InP GaAs HEMTs or HBT provide higher cutoff frequencies and lower noise figures than their GaAs counterparts. InP HEMTs also operate at lower drain voltages, and, therefore, draw less power than GaAs HEMTs. Also, at the same output power level, InP HEMTs have a higher power-added efficiency (PAE) than GaAs HEMTs. PAE is a measure of the amplifier's performance, and it correlates to the amount of output signal power produced by the amplifier compared to the input signal power and the DC supply voltage and current.

The connections between transistors and other circuit elements in a power amplifier pose several challenges in circuit design. These challenges are especially evident in radio frequency (RF) applications. RF applications typically have operating frequencies from several hundred megahertz (MHz) to more than one hundred gigahertz (GHz). In order to effectively combine the power outputs from individual transistors to a higher power output, all the individual transistors have to be combined in phase with balanced amplitudes. The overall efficiency of an amplifier is partially dependent on correctly matching these properties. The more accurately the design matches the phase and amplitude of the various signals, the more efficiently the amplifier will operate. An efficient power amplifier has a high gain and a low internal power loss. When the phase and amplitude of the components' impedance are not properly matched, the amplifier loses efficiency and it operates at a lower gain and dissipates more power internally. Power amplifiers also experience the negative effect of a reduced gain at higher operating frequencies. This phenomenon makes it especially advantageous to optimize the gain of power amplifiers for high frequency applications.

Traditionally, circuit designers use the interconnects to the transistors to correct mismatches in phase and amplitude of the device impedances. By specializing the interconnects, circuit designers can correct many deficiencies. For example, the width of a transmission line is directly related to its impedance. Thus, varying the width of the lines by using wider transmission lines will allow for proper impedance matching. Additionally, varying the lengths of the interconnects or tapering the interconnects will also serve to match different phases and amplitudes of the individual transistor's impedance. Tapering the transmission lines is another technique that helps to match the phase and impedance.

These interconnect design techniques suffer from several drawbacks. For example, wide transmission lines allow transverse signal transmission, especially at high frequencies. Instead of being directed toward the next stage, a signal that travels transversely takes a longer and less efficient path along the interconnect. This inefficient signal propagation degrades the performance of the amplifier. Matching phase and amplitude of the transistors' impedances through longer interconnects also requires a larger chip area and significantly increases the size of the amplifier. Tapering the transmission lines introduces a high conductive loss in the network. Increasing the conductive loss reduces the power of the transmitted signal, and this reduces the gain of the amplifier. Because the conductive loss, from both tapering and from longer interconnects, degrades the performance of the network, there is a serious trade-off from the phase and amplitude matching benefits achieved by lengthening or widening the transmission lines.

In addition to the previously discussed limitations, current network matching techniques utilize square corners in their interconnects. Square corners cause additional power loss through radiation, and, therefore, reduce the efficiency of the amplifier.

A simpler method of interconnecting transistors in a power amplifier network is needed. The method must reduce the conductive losses incurred by current methods, reduce the chip area required by the interconnects and simultaneously reduce or eliminate transverse signal transmission.

SUMMARY OF THE INVENTION

In accordance with the teachings of the present invention, an umbrella-shaped matching network for matching phase and amplitude of the impedances of the power transistors in a power amplifier circuit is disclosed. The matching network is a specialized interconnect between the power transistors and other circuit components in the amplifier. The network serves as an impedance transforming network because it changes the low power-matched device impedance to an intermediate impedance before connecting the network to a load.

The matching network includes rounded corners to reduce microwave signal scattering losses, and to be less prone to signal radiation and subsequent scattering losses than the square corner designs used in traditional matching networks. The matching network further includes slits that prevent current from traveling in the transverse direction, and help direct the current forward towards the load. This prevents the impedance transformer from self-resonating. The slits are also contoured to provide phase and amplitude balancing for the signals transmitted to the transistors. Because the interconnects don't have to be lengthened or tapered to provide phase and amplitude balancing, the required chip area and the power loss associated with longer transmission lines is significantly reduced.

Additional objects, advantages and features of the present invention will become apparent from the following description and appended claims, taken in conjunction with the accompanying drawings.

DETAILED DESCRIPTION OF THE PREFERRED EMBODIMENTS

Figure 1:
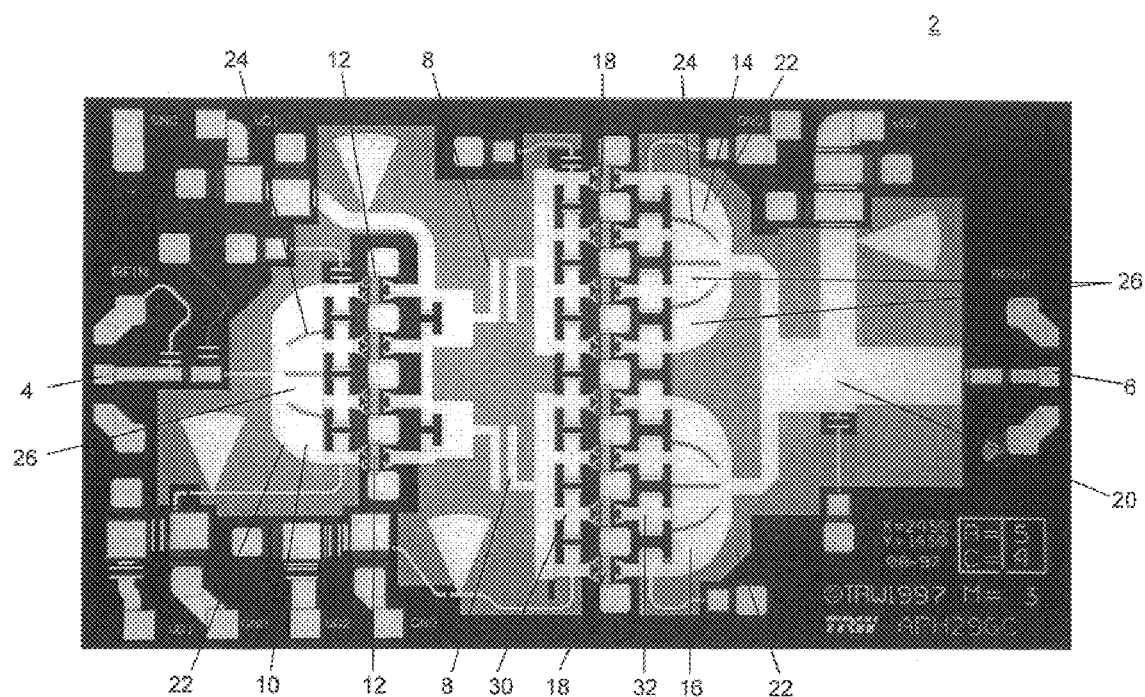
FIG. 1 is a schematic layout view of a circuit board that includes an InP W-band MMIC power amplifier employing an umbrella-shaped matching network in its design, according to an embodiment of the present invention.

The following discussion of the preferred embodiments directed to a phase and amplitude impedance matching network in a power amplifier is merely exemplary in nature and is in no way intended to limit the invention or its applications or uses.

FIG. 1 is a top plan view of a MMIC power amplifier 2. The power amplifier 2 includes two stages. An RF input terminal 4 is connected to the first stage and an RF output terminal 6 is connected to the second stage. The two stages are electrically coupled together through a stage coupling interconnect 8. The first stage includes an umbrella-shaped matching network 10 connecting the input terminal 4 to four first stage field-effect transistors (FETs) 12. The second stage includes umbrella-shaped matching networks 14 and 16 connecting eight second stage FETs 18 to the output terminal 6. An interconnect 20 connects the networks 14 and 16 to the output terminal 6. The amplifier 2 includes other inputs (not shown) for power and ground connections to the transistors 12 and 18 and for connections to other circuit signals. The gaps adjacent to the transistors 12 and 18 and the networks 10, 14 and 16 reveal the substrate used in fabrication. The amplifier 2 includes other circuit components, such as capacitors, inductors, and resistors, electrically connected in a manner known to those skilled in the art. The components and connections within the amplifier 2, excluding the matching networks 10, 14 and 16, are well known in the art.

An RF input signal enters the amplifier 2 through the RF input terminal 4 and propagates through the matching network 10 to the first stage transistors 12. The first stage transistors 12 are connected to the second stage transistors 18 through the stage interconnects 8. The interconnects 8 provide a DC block between the two stages and increase the amplifier's stability. The signal propagates through the matching networks 14 and 16, through the interconnect 20, to the RF output terminal 6 and then to a load (not shown).

In one embodiment, the networks 10, 14 and 16 used in the present design are formed from 3.0 micrometer thick gold patterned on the chip through metallization. Alternative embodiments of this invention may use different thicknesses or processes for creating the interconnects. Although gold is the most common metal used to form interconnects at high frequencies, alternative metals may be used.

Each of the matching networks 10, 14 and 16 include rounded corners 22 to reduce microwave signal scattering losses. The rounded corners 22 are less prone to signal radiation than the square corners of known power combining networks. The rounded corners 22 also effectively reduce signal loss due to radiation.

Further, each of the matching networks 10, 14 and 16 include rounded openings or slits 24 that separate the networks 10, 14 and 16 into separated arms 26 to help prevent current from propagating transversely across the networks 10, 14 and 16. In traditional designs, the width of the transmission lines are increased to match phase and impedance, but this has the undesirable effects discussed above. At any given operating frequency, as the width of the transmission line approaches $\lambda/2$ of the propagating signal, the impedance-transforming network will self-resonate, and the electromagnetic (EM) waves will propagate in a transverse direction instead of forward toward the load. The slits 24 in the present design prevent the current from traveling in the transverse direction and, therefore, prevent the amplifier 2 from self-resonating.

Amplitude and phase for the signal presented to the transistors 12 and 18 are also balanced by the slits 24. Therefore, the exact shape and the dimensions of the matching networks 10, 14 and 16 may be varied to achieve the desired phase and amplitude balancing characteristics in the network. This may include lengthening or shortening the overall length and width of the networks 10, 14 and 16. Additionally, it is possible to vary the phase and amplitude of individual signals by adjusting the dimensions of the individual arms of the matching networks 10, 14 and 16.

The structure of the matching networks 10, 14 and 16 of the present design significantly increases the power added efficiency (PAE) when compared to previous matching networks. See, for example, Y. C. Chen, D. L. Ingram, R. Lai, M. Barsky, R. Grunbacher, T. Block, H. C. Yen and D. C. Streit, "A 95 GHz HEMT MMIC Amplifier with 427 mW Power Output," IEEE Microwave and Guided Wave Letters, Volume 8, Number 11, pp. 399–401, November 1998.

The connections between the matching networks 10, 14, and 16 and the transistors 12 and 18 achieve a substantial performance gain while balancing the difficulty of matching phases and amplitude of the signals of many transistors in a single umbrella-shaped network configuration. Alternative embodiments may connect more or fewer transistors through the use of a single umbrella-shaped network.

Although not illustrated in this design, it is also possible to cascade two or more levels of the umbrella-shaped network connections. For example, it is possible to connect sixteen transistors using five umbrella-shaped networks. Four networks optimally each connect their inputs to four transistors respectively. A fifth umbrella-shaped network would cascade the outputs of the previous four networks together to form a single output from the fifth umbrella-shaped network.

FIG. 1 depicts symmetric matching networks 10, 14 and 16, but other designs may employ non-symmetric designs to achieve their desired phase and amplitude balances. The networks 10, 14 and 16 may be used to connect several inputs to a single output or, conversely, to connect a single input to multiple outputs. The matching network 14 takes a single input and matches it to four outputs. The matching networks 10 and 16 take four inputs and match them to a single output.

The network connections to the transistors 12 and 18 are made to the drain terminal of the respective transistors. Harmonic terminations 30 and 32 are placed at the drain terminal to improve the PAE and the out-of-band stability of the amplifier 2. Odd mode clamping resistors (not shown) are inserted between the transistors 12 and 18 to suppress the push-pull oscillation.

In one embodiment, the transistors 12 and 18 are InP MMIC HEMTs, which have enhanced carrier confinement and superior transport properties that increase their cutoff frequencies and decrease their noise figures. Alternative embodiments may utilize other types of substrates such as GaAs or silicon based MMIC power amplifiers. Additional embodiments may also include networks of bipolar or other types of transistors, or they may include networks that do not have specific power electronics applications. Alternative embodiments may also connect the networks 10, 14 and 16 to terminals other than the drain.

Biasing the amplifier 2 at class AB with $V_{ds}=2.5$ V and $V_{gs}=0$ V achieved the optimal power and PAE combination. The amplifier 2 produced an output power of 407 mW with a 20% PAE and an 8.8 dB associated gain. When biased at $V_{ds}=3.0$ V and $V_{gs}=0$ V, for maximum power, the amplifier delivered an output power of 427 mW with a 19% PAE and an 8.2 dB associated gain. Both of these results were produced at operating frequencies of 95 GHz. Previous power amplifier designs only produced a maximum output power of 130 mW with a 13% PAE at 95 GHz. The techniques used in this design produced a chip with dimensions of 1.45 mm×2.45 mm.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A monolithically integrated power amplifier circuit, said circuit comprising:

a substrate;

a plurality of transistors monolithically integrated on the substrate;

a planar interconnect having a generally symmetrical umbrella-shape, said interconnect being monolithically integrated on the substrate, said interconnect having a generally straight edge and a curved portion, said curved portion including a plurality of slits defining individual arms in the interconnect; and a plurality of terminals monolithically integrated and positioned on the substrate along the straight edge, said terminals being connected through the individual arms to a single terminal at the apex of the curved portion, wherein the plurality of terminals are connected to the plurality of transistors so that the single terminal provides a combined output of the transistors and wherein the interconnect is designed to provide signal phase and amplitude matching.

2. The circuit according to claim 1 wherein the curved portion includes rounded corners at an end of the curved portion opposite to the straight edge.

3. The circuit according to claim 1 wherein the plurality of terminals include rectangularly-shaped harmonic terminators.

4. The circuit according to claim 1 where the plurality of terminals are connected to the drain terminals of the plurality of transistors.

5. The circuit according to claim 1 where the length, position, and width of the slits may be adjusted to control the phase and impedance balance of the signals.

6. The circuit according to claim 1 wherein two or more umbrella-shaped planar interconnects are attached together in a cascading manner.

7. The circuit according to claim 1 wherein the connections between the plurality of terminals and the single terminal are contoured to adjust their phase and amplitude matching properties.

8. The circuit according to claim 1 wherein the overall shape of the umbrella-shaped interconnect may be varied so as to vary the network's phase and impedance matching properties.

9. The circuit according to claim 1 where the umbrella-shaped interconnect is formed through the process of metallization on the circuit board.

10. The circuit according to claim 9 where the metal forming the umbrella-shaped interconnect includes aluminum.

11. A monolithically integrated power amplifier circuit comprising:

a substrate;

a plurality of transistors monolithically integrated on the substrate;

an input terminal, an output terminal and an intermediate power amplifier network including a combination of interconnected circuit components monolithically integrated on the substrate; and a matching network monolithically integrated on the substrate, said matching network including at least one generally umbrella-shaped planar interconnect having one end with multiple terminals and an opposite end with a single terminal, wherein the multiple terminals are connected to the single terminal through a plurality of curved arms that are separated from each other by slits in the interconnect, said matching network providing phase and amplitude matching.

12. The circuit according to claim 11 wherein one or more arms of the umbrella-shaped network are contoured to change the phase and impedance of its input and output signals.

13. The circuit according to claim 11 further comprising rectangularly-shaped harmonic terminations attached to the multiple terminals of the interconnect.

14. The circuit according to claim 11 wherein the interconnect includes rounded corners at the end including the single terminal.

15. The circuit according to claim 11 wherein the umbrella-shaped interconnect provides a connection for multiple inputs at the multiple terminals and produces a single output at the single terminal.

16. The circuit according to claim 11 wherein the umbrella-shaped interconnect provides a connection for one or more transistors to the input terminal.

17. The circuit according to claim 11 wherein the umbrella-shaped interconnect connects a single input at the single terminal end and produces multiple outputs at the multiple terminal end.

18. The circuit according to claim 11 wherein the matching network includes two or more umbrella-shaped interconnects cascaded together.

19. A method for matching phase and amplitude of the transistor impedances in a monolithically integrated power amplifier circuit network comprising:

providing a substrate;

monolithically integrating a plurality of transistors on the substrate;

monolithically integrating a planar umbrella-shaped matching network on the substrate electrically coupled to the transistors;

applying a signal to the umbrella-shaped matching network, said matching network including a plurality of slits defining separated arms;

adjusting the contours and dimensions of the matching network to alter the amplitude and phase characteristics of an output signal; and adjusting the contours and dimensions of the arms to further define the phase and amplitude characteristics of the output signal.

20. The method of claim 19 further comprising the step of adding generally rectangular harmonic terminations to the plurality of terminals to adjust its signal characteristics.

21. The method of claim 19 further comprising the steps of changing the length, width and contour of the slits to vary the amplitude impedance and phase properties of the arms and the matching network.

* * * * *